(12) United States Patent
Nakata et al.

(10) Patent No.: US 7,170,177 B2
(45) Date of Patent: Jan. 30, 2007

(54) SEMICONDUCTOR APPARATUS

(75) Inventors: Yoshihiro Nakata, Kawasaki (JP);
Katsumi Suzuki, Kawasaki (JP); Iwao Sugiura, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 112 days.

(21) Appl. No.: 11/115,407

(22) Filed: Apr. 27, 2005

(65) Prior Publication Data

US 2005/0253271 A1    Nov. 17, 2005

Related U.S. Application Data

(63) Continuation of application No. PCT/JP03/06357, filed on May 21, 2003.

(51) Int. Cl.
*H01L 23/48* (2006.01)
(52) U.S. Cl. .................. 257/758; 257/734; 257/774
(58) Field of Classification Search ........... 257/774, 257/758, 734
See application file for complete search history.

(56) References Cited

U.S. PATENT DOCUMENTS 5,880,018 A    3/1999    Boeck et al.
6,410,462 B1    6/2002    Yang et al.
6,482,733 B2 *    11/2002    Raaijmakers et al. ........ 438/633
6,627,540 B2 *    9/2003    Lee ............................ 438/638

FOREIGN PATENT DOCUMENTS

| JP | 2001-274239 | 10/2001 |
| JP | 2002-164428 | 6/2002 |
| JP | 2002-305193 | 10/2002 |
| WO | WO 00/13221 | 3/2000 |

OTHER PUBLICATIONS

"Applied Physics" vol. 68, No. 11, 1999, pp. 1214-1278, ULSI Multilayer Wiring Technology.

* cited by examiner

*Primary Examiner*—Roy Potter
(74) *Attorney, Agent, or Firm*—Westerman, Hattori, Daniels & Adrian, LLP.

(57) ABSTRACT

A disclosed semiconductor apparatus includes a substrate, a first insulating layer formed on the substrate, the first insulating layer including a Cu wiring part, and a second insulating layer formed on the substrate, the second insulating layer including a Cu via plug part electrically connected to the Cu wiring part. The first insulating layer is a porous insulating film having an elastic modulus of 5 GPa or more and a hardness of 0.6 GPa or more, and the second insulating layer has an elastic modulus of no less than 10 GPa and a hardness no less than 1 GPa.

11 Claims, 15 Drawing Sheets

SEMICONDUCTOR APPARATUS

CROSS-REFERENCE TO RELATED APPLICATIONS

This application is a U.S. continuation application filed under 35 USC 111(a) claiming benefit under 35 USC 120 and 365(c) of PCT application JP 2003/006357, filed May 21, 2003. The foregoing application is hereby incorporated herein by reference.

BACKGROUND OF THE INVENTION

1. Field of the Invention

The present invention generally relates to a semiconductor apparatus, and more particularly to a semiconductor apparatus including a multilayer wiring structure.

2. Description of the Related Art

In recent years and continuing, operating speed is increased by miniaturizing a semiconductor apparatus in accordance with scaling law. In recent high density semiconductor integrated circuit apparatuses, a multilayer wiring structure is, in general, used for wiring between respective semiconductor apparatuses. With the multilayer wiring structure, however, the proximal arrangement of the wiring patterns in the multilayer wiring structure causes wire delay from parasitic capacity between the wiring patterns. The parasitic capacity is in inverse proportion to the distance between the wiring patterns and is proportional to the dielectric constant of an insulator between the wiring patterns.

Accordingly, in order to solve the problem of wire delay in the multilayer wiring structure, an interlayer dielectric having a low dielectric constant is proposed to be used as the interlayer dielectric so as to reduce the parasitic capacity. The dielectric constant is approximately 4 in a case of a conventional example using a CVD-$SiO_2$ film as the interlayer dielectric. For further reducing the dielectric constant, the dielectric constant may be, at most, approximately 3.3–3.5 in a case of using SiOF which is a CVD-$SiO_2$ film with fluorine added. This reduction of dielectric constant, however, is insufficient for satisfying the current high density semiconductor integrated circuits and causes difficulty in obtaining necessary operating speed.

Therefore, in order to further reduce the dielectric constant, a porous insulating film formed by a spin coating method is proposed to be used as the interlayer dielectric having a low dielectric constant. In obtaining the porous insulating film, a coating material with an organic resin material added that evaporates or decomposes from heat is spin coated on an insulating film. Then, the coating material is heated for evaporating or decomposing materials including, for example, the organic resin material. As a result, the insulating film is formed into the porous insulating film.

By forming the insulating film into a porous insulating film, the dielectric constant of the insulating film can be reduced to 2.5 or less.

The above-described wire delay is proportional to the product of the wire resistance and the parasitic capacity between the wires. Therefore, in recent years, Cu that has low resistance is used as an alternative to the conventional wiring material of Al.

FIG. 1 is a cross-sectional view showing a portion of a semiconductor apparatus 100 using the above-described porous insulating film.

With reference to FIG. 1, the semiconductor apparatus 100 includes an element area separated by an element separating film 102 on a Si substrate 101. A gate insulating film 104A disposed on the Si substrate 101, a gate electrode 104 formed on the gate insulating film 104A, and diffusion layers 105A, 105B formed on corresponding sides of the gate electrode 104 are formed on the element area.

The side walls of the gate electrode 104 are covered by corresponding side wall insulating films 103A and 103B. Furthermore, an interlayer dielectric 106 is formed as a PSG (phosphosilicate glass) film on the Si substrate in a manner covering the gate electrode 104 and the side wall insulating films 103A, 103B.

A porous insulating film 110, being an interlayer dielectric having low dielectric constant, is formed on the interlayer dielectric 106 via a stopper film 107. A Cu wiring part 117 and a barrier film 117A formed in a manner surrounding the Cu wiring are provided in the porous insulating film 110.

The Cu wiring part 117 is electrically connected to the diffusion layer 105B via a contact plug 108 formed in the interlayer dielectric 106.

A protective film 111 and a stopper film 112 are formed on the porous insulating film 110. Furthermore, another porous insulating film 113 including a Cu plug part 118 and a barrier film 118A surrounding the Cu plug part 118 is formed on the stopper film 112.

The Cu plug part 118 is configured to be electrically connected to the Cu wiring part 117 via a barrier film 118A.

Furthermore, a stopper film 114 is formed on the porous insulating film 113. Another porous insulating film 115, which includes a Cu wiring part 119 and a barrier film 119A surrounding the Cu wiring part 119, is formed on the stopper film 114. Furthermore, a protective film 116, which is used during etching of the porous insulating film 115, is formed on the porous insulating film 115.

The Cu wiring part 119 is configured to be electrically connected to the Cu plug 118.

Since the semiconductor apparatus 100 shown in FIG. 1 employs a combination of porous insulating films (being interlayer dielectrics with low dielectric constant) and Cu wiring patterns (having low wire resistance), the semiconductor apparatus 100 has little wire delay and is able to operate at high speed.

The configuration shown in FIG. 1, however, is subject to problems such as disconnection/deformation of the Cu wiring in the multilayer wiring structure and damaging of the porous insulating film especially in a case where strict miniaturization is executed under a design rule of approximately 0.1 μm.

FIG. 2 is a perspective view showing a connected state of the Cu wiring parts 117, 119 and the Cu plug part 118 in the configuration shown in FIG. 1. It is to be noted, however, that the porous insulating film surrounding the Cu wiring parts 117, 119 and the Cu plug part 118 is not shown in FIG. 2.

With reference to FIG. 2, the Cu wiring parts 117 and 119, for example, are formed substantially parallel to the Si substrate 101, and have a volume which is greater than that of the Cu plug part 118. The Cu plug part 118 has a substantially cylindrical shape, has a cross-sectional area which is smaller than that of the Cu wiring parts 117, 119, and is disposed in a manner interposed between the Cu wiring parts 117, 119.

With the semiconductor apparatus 100 having the above-described configuration, stress transmitted via the Cu tends to concentrate at the Cu plug part 118. Furthermore, the semiconductor apparatus 100 has a low elastic modulus owing to the porous insulating film 113 serving as the insulating film surrounding the Cu plug part 118 and to the hole in the porous insulating film 113. Therefore, the porous insulating film 113 is easily deformed by the stress applied thereto and leads to a problem of the stress concentrating at the Cu plug part 118.

FIG. 3 is a diagram showing simulation results for evaluating stress in the Cu wiring parts and the Cu plug part (via plug) in a direction X substantially perpendicular to the Si substrate 101. In this case, calculation is performed under conditions where the value of the elastic modulus of the porous insulating film surrounding the Cu wiring parts and the Cu plug part is set to 5 GPa and the value of the hardness thereof is set to 0.6 GPa.

With reference to FIG. 3, the stress applied to the Cu wiring parts is greater than the stress applied to the Cu plug part. This shows that stress is concentrated in the Cu plug part in a multilayer wiring structure using Cu material.

With the configuration shown in FIG. 1, problems such as disconnection/deformation of the Cu plug part and damaging of the porous insulating film due to the deformation of the Cu plug part become apparent during a process of forming a contact pad on the porous insulating film 115 via a cap layer and wire bonding a wire to the contact pad.

Furthermore, the problems of disconnection/deformation of the Cu plug part and damaging of the porous insulating film may also be caused, for example, by stress from superposing the multilayer wiring or by thermal stress.

One reason for these problems is that the elastic modulus of the porous insulating films surrounding the Cu wiring parts and the Cu plug part is small compared to that of the inorganic insulating films (e.g. CVD-SiO$_2$ film). Another reason is that stress tends to concentrate on the Cu plug part. The problem of deformation and disconnection of the multilayer wiring structure is particularly critical with respect to the stress created during the wire bonding process.

SUMMARY OF THE INVENTION

It is a general object of the present invention to provide a semiconductor apparatus that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor apparatus including: a substrate; a first insulating layer formed on the substrate, the first insulating layer including a Cu wiring part; and a second insulating layer formed on the substrate, the second insulating layer including a Cu via plug part electrically connected to the Cu wiring part; wherein the first insulating layer is a porous insulating film having an elastic modulus of 5 GPa or more and a hardness of 0.6 GPa or more, and the second insulating layer has an elastic modulus of no less than 10 GPa and a hardness no less than 1 GPa.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
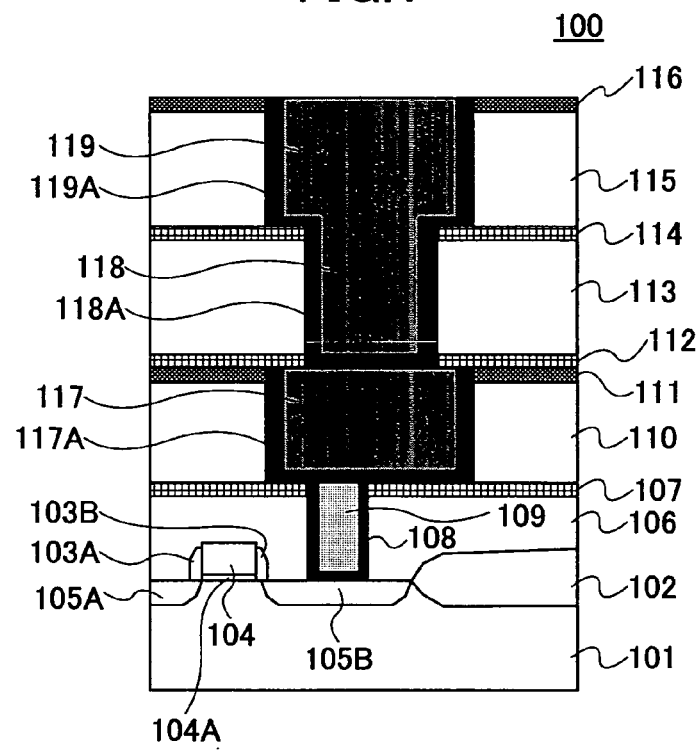
FIG. 1 is a schematic drawing showing a configuration of a conventional semiconductor apparatus having a multilayer wiring structure.
Figure 2:
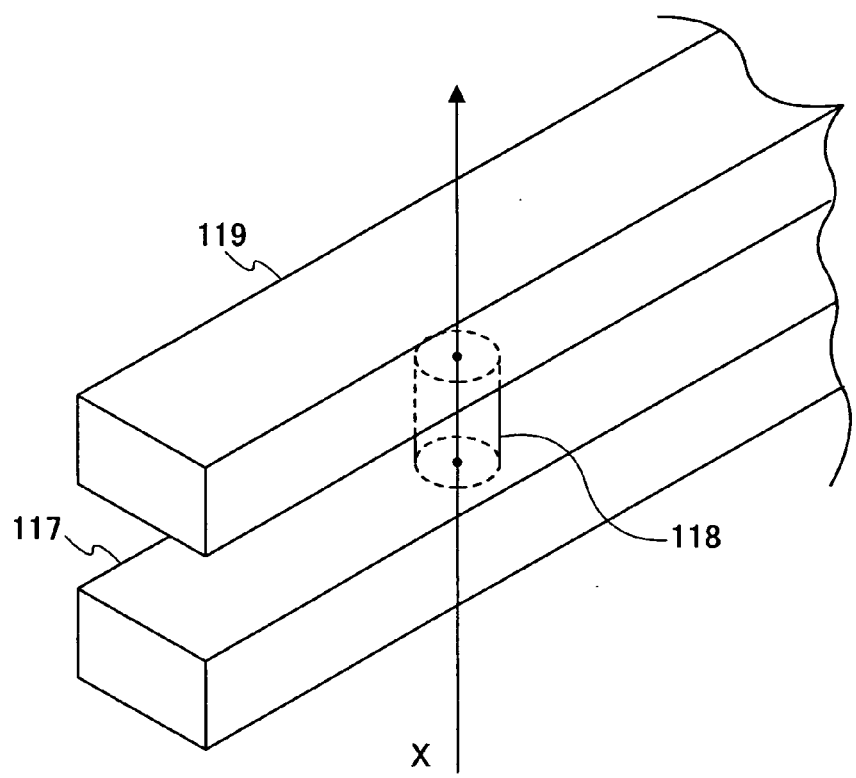
FIG. 2 is a perspective view showing a structure of a Cu wiring part and a Cu plug part in a conventional semiconductor apparatus having a multilayer wiring structure.
Figure 3:
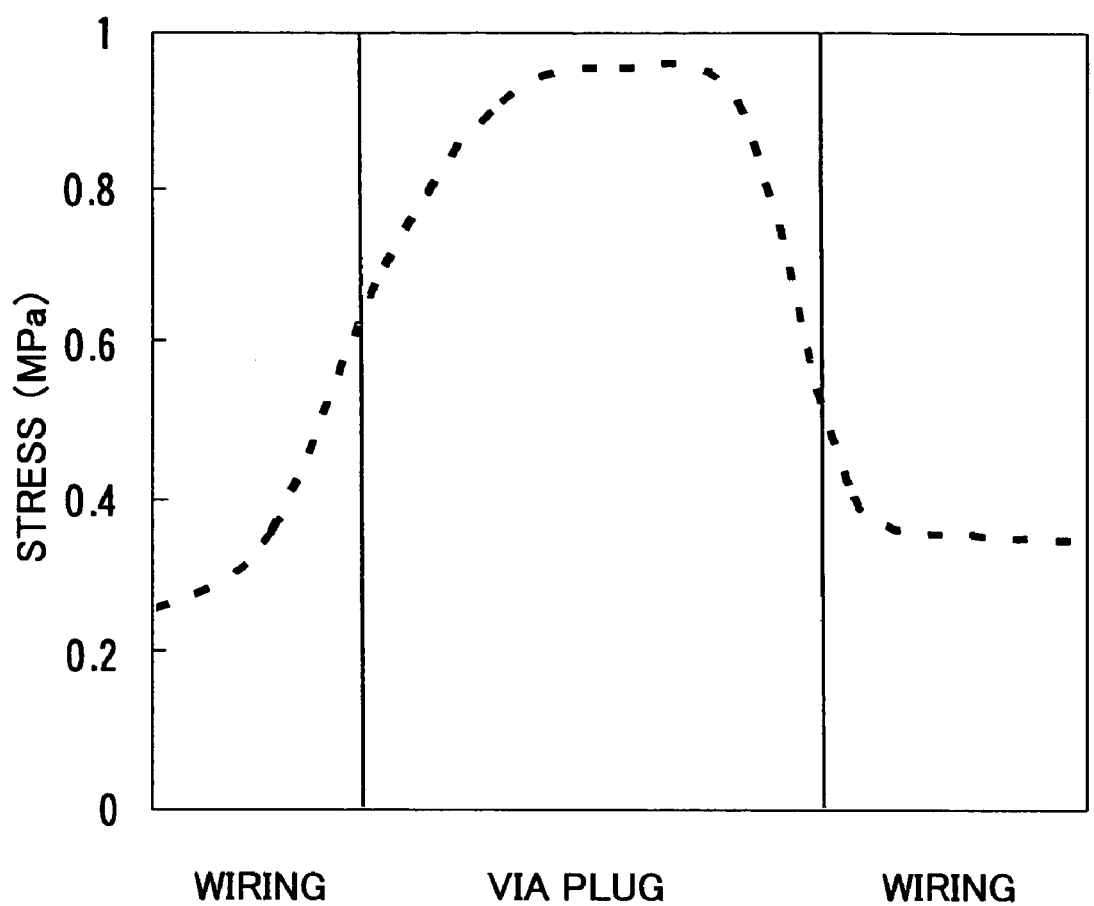
FIG. 3 is a diagram showing distribution of pressure in a conventional multilayer wiring structure.
Figure 4:
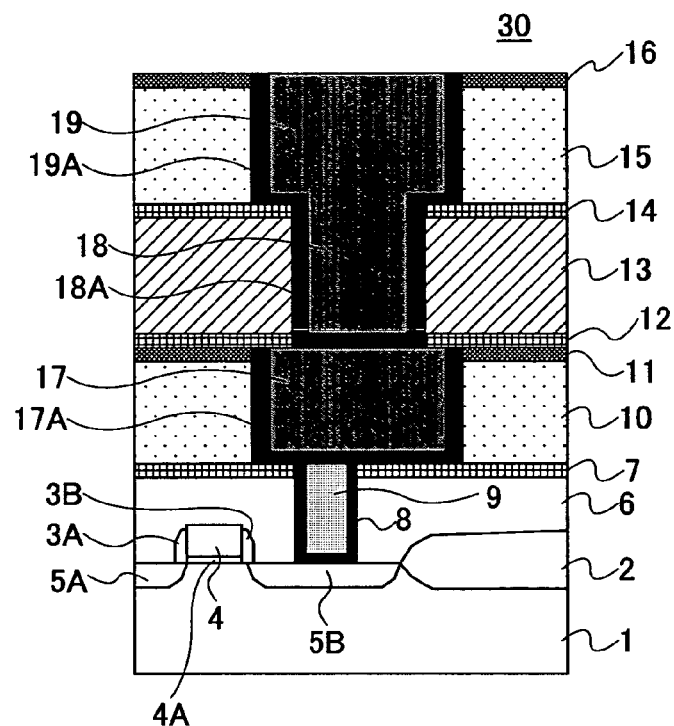
FIG. 4 is a schematic drawing showing a configuration of a semiconductor apparatus having a multilayer wiring structure according to a first embodiment of the present invention.

FIG. 4 is a cross-sectional view showing a configuration of a semiconductor apparatus 30 according to a first embodiment of the present invention. With reference to FIG. 4, the semiconductor apparatus 30 includes an element area separated by an element separating film 2 on a Si substrate 1. A gate insulating film 4A disposed on the Si substrate 1, a gate electrode 4 formed on the gate insulating film 4A, and diffusion layers 5A, 5B formed on corresponding sides of the gate electrode 4 are formed on the element area.

The side walls of the gate electrode 4 are covered by side wall insulating films 3A and 3B. Furthermore, an interlayer dielectric 6 is formed as a PSG film (phosphosilicate glass film) on the Si substrate 1 in a manner covering the gate electrode 4 and the side wall insulating films 3A, 3B.

A contact hole which communicates with the diffusion layer 5B is formed in the interlayer dielectric 6. A barrier film 8 made of TiN is provided on the inner wall(s) of the contact hole. A contact plug 9 made of W (tungsten) is buried in the contact hole.

A porous insulating film 10, being an interlayer dielectric having low dielectric constant, is formed on the interlayer dielectric 6 via a stopper film 7. A Cu wiring part 17 and a barrier film 17A formed in a manner surrounding the Cu wiring part 17 are provided in the porous insulating film 10.

The porous insulating film 10 is formed of a porous silica film. The porous silica film is applied by employing, for example, a spin coating method (described below). The porous insulating film 10 is a so-called interlayer dielectric with low dielectric constant, in which the film has holes formed therein. The dielectric constant of the porous insulating film 10 can be 2.5 or less. The dielectric constant of the porous silica film used in the first embodiment of the present invention is approximately 2.2.

The Cu wiring part 17 is electrically connected to the contact plug 9 inserted through an opening part of the stopper film 7 via the barrier film 17A. The contact plug 9 is configured to be electrically connected to the diffusion layer 5B via the barrier film 8.

Furthermore, a protective film 11 and a stopper film (etch stopper film) 12 are formed on the porous insulating film 10. Furthermore, an insulating film 13 made of SiOC is formed on the stopper film 12 by, for example, a CVD (Chemical Vapor Deposition) method.

A Cu plug part 18 and a barrier film 18A surrounding the Cu plug part 18 are formed in the insulating film 13.

The Cu plug part 18 is electrically connected to the Cu wiring part 17 at an opening part in the stopper film 12 and the protective film 11 via the barrier film 18A.

Furthermore, a porous insulating film 15 made of porous silica (formed with a same method as the porous insulating film 10) is formed on a stopper film (etch stopper film) 14. A Cu wiring part 19 and a barrier film 19A surrounding the Cu wiring part 19 are formed in the porous insulting film 15. For example, in a case where the Cu plug part 18 and the Cu wiring part 19 are formed substantially in a same process by employing a dual damascene method (described below), the Cu plug part 18 is configured to be consecutively formed from an opening part of the stopper film 14 to the wiring part 19. Furthermore, a protective film 16, which is used during etching of the porous insulating film 15, is formed on the porous insulating film 15.

Accordingly, in the semiconductor apparatus 30 having the multilayer wiring structure, the insulating film 13 made of SiOC (e.g. formed with a CVD method) is employed as the insulating film for separating the Cu plug parts 18. The insulating film 13 made of SiOC is employed since the insulating film 13 has an elastic modulus and a hardness which are greater than those of the porous silica film used for separating the Cu wiring parts 17, 19.

As a result, stress is prevented from concentrating in the Cu plug part 18, and deformation/disconnection of the Cu plug part 18 as well as damaging of the insulating films and the porous silica film can be reduced.

Figure 5:
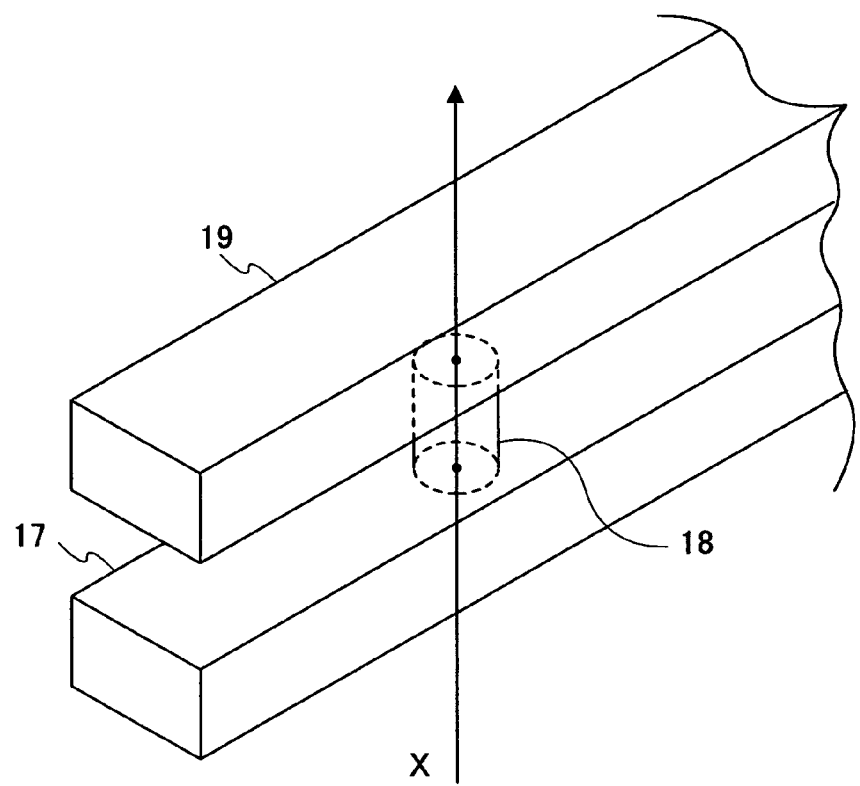
FIG. 5 is a perspective view showing a structure of a Cu wiring part and a Cu plug part in a semiconductor apparatus having a multilayer wiring structure according to an embodiment of the present invention.

FIG. 5 is a perspective view showing the Cu wiring parts 17, 19 and the Cu plug part 18. It is to be noted that the porous silica film surrounding the Cu wiring parts 17, 19 and the insulating film surrounding the Cu plug part 18 are not shown in FIG. 5.

With reference to FIG. 5, the Cu wiring parts 17 and 19, for example, are formed substantially parallel to the Si substrate 1, and have a volume which is greater than that of the Cu plug part 18. The Cu plug part 18 has a substantially cylindrical shape, has a cross-sectional area which is smaller than that of the Cu wiring parts 17, 19, and is disposed in a manner interposed between the Cu wiring parts 17, 19.

With the semiconductor apparatus 30 having the above-described configuration, stress transmitted via the Cu tends to concentrate at the Cu plug part 18.

Accordingly, in order to effectively reduce the stress concentrating on the Cu plug part 18, the present invention employs a film material which is harder than the porous insulating films surrounding the Cu wiring parts 17, 19 as the insulating film surrounding the Cu plug part 18. That is, in the present invention, a film material, having greater elastic modulus and hardness than those of the porous insulating films surrounding the Cu wiring parts, is employed as the insulating film surrounding the Cu plug part 18.

Figure 6:
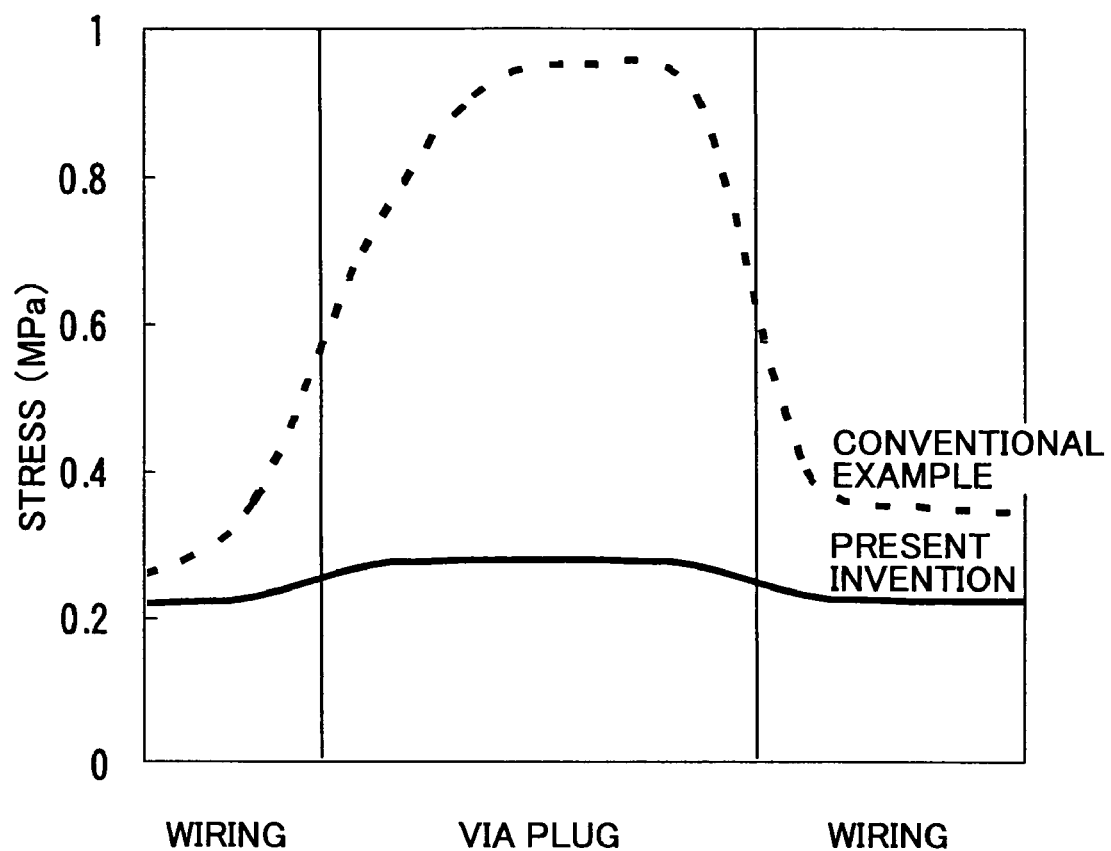
FIG. 6 is a diagram for showing the advantages of the present invention.

FIG. 6 is a diagram showing results for calculating stress in a direction X substantially perpendicular to the Si substrate 1 (traveling through the center of the Cu plug part 18 as shown in FIG. 5). In this case, calculation is performed under conditions where the value of the elastic modulus of the porous insulating films 10, 15 surrounding the Cu wiring parts 17, 19 is 5 GPa, where the hardness of the porous insulating films 10, 15 surrounding the Cu wiring parts 17, 19 is set to 0.6 GPa, where the value of the elastic modulus of the insulating film 13 surrounding the Cu plug part is set to 10 GPa, and where the value of the hardness of the insulating film 13 surrounding the Cu plug part is set to 1.2 GPa. In addition, calculation results of the conventional example using porous insulating film for the surrounding of the Cu plug part is also shown in FIG. 6 for comparison.

In comparison with the conventional example, FIG. 6 shows that the present invention is able to reduce the stress applied to the Cu plug part 18 to a small amount. This is due to the high elastic modulus and hardness of the insulating film formed in the periphery of the Cu plug part 18 for separating the Cu plug parts. Accordingly, in a case where stress is applied to the insulating films formed in the Cu wiring parts and the Cu plug part, the plastic deformation of the insulating film surrounding the Cu plug part and the stress applied to the Cu plug part can be reduced. Hence, disconnection/deformation of the Cu plug part along with the damaging of the insulating films and porous insulating films can be prevented.

According to the calculation results shown in FIG. 6, the stress applied to the Cu plug part can be reduced to an amount which is less than the yield stress limit of the Cu plug part by setting the elastic modulus of the porous insulating film surrounding the Cu wiring part to a value of 5 GPa or more, the hardness of the porous insulating film surrounding the Cu wiring part to a value of 0.6 GPa or more, the elastic modulus of the insulating film surrounding the Cu plug part to a value of 10 GPa or more, and the hardness of the insulating film surrounding the Cu plug part to a value of 1 GPa or more. Thereby, it is apparent that disconnection/deformation of the Cu plug part along with the damaging of the insulating films and porous insulating films can be prevented.

Next, the insulating film 13 and the porous insulating films 10, 15 shown in FIG. 4 are described.

The insulating film 13 is not to be limited to a particular type of film as long as the elastic modulus thereof is set to a value of 10 GPa or more, and the hardness thereof is set to a value of 1 GPa or more.

The insulating film 13 may be, for example, a $SiO_2$ film, a SiC film, a SiN film, a SiON film, a FSG (SiOF) film, or a SiOC film formed by, for example, a plasma CVD method. Furthermore, an organic SOG film (Spin On Glass coating film formed by a spin coating method, for example) or an inorganic SOG film may also be employed.

Since the distance between one Cu via plug part and another Cu via plug part is, in general, greater than the space between the Cu wiring parts, the parasitic capacity between Cu via plug parts in relation to the problem of wire delay is not as critical as that of the Cu wiring parts.

Accordingly, even if an insulating film having a dielectric constant greater than the porous insulating film is employed as the insulating film serving to separate the Cu via plug parts, such use would not have a large influence on the operating speed of the semiconductor apparatus. Therefore, a film having an elastic modulus and a hardness of large values (e.g. a SiOC film formed by a CVD method) can be employed to reduce the stress applied to the Cu plug part without adversely affecting the operating speed of the semiconductor apparatus having the multilayer wiring structure.

For example, in a case where a SiOC film formed with the plasma CVD method is used, the SiOC film is able to sufficiently provide the desired values of elastic modulus and hardness and reduce the dielectric constant to a low amount compared to CVD-$SiO_2$, for example. More specifically, in a case where an SiOC film is formed by using tetra methyl silane gas in a plasma CVD method, the film has an elastic modulus of 15 GPa, a hardness of 2.1 GPa, and a dielectric constant of 3.1.

Thereby, the insulating film made of SiOC is employed as the insulating film 13 in the semiconductor apparatus 30 shown in FIG. 4.

Next, the porous insulating films 10 and 13 are described. In the semiconductor apparatus having the multilayer wiring structure according to the first embodiment of the present invention, it is desired for the porous insulating film serving to separate the Cu wiring parts to have an elastic modulus of 5 GPa or more and a hardness of 0.6 GPa or more.

Furthermore, since the Cu wiring parts are closely situated to one another, it is desired to reduce dielectric constant by providing a porous configuration to an insulating film and reduce the parasitic capacity amount between the wires, to thereby reduce wire delay and obtain a sufficient operating speed for the semiconductor apparatus.

The porous insulating film may be, for example, a porous SiOC film formed by a CVD method, or a porous silica film formed by a prescribed coating method.

For example, in forming the porous silica film with a prescribed coating method, it is preferable to use a liquid composition containing an organic silicon compound obtained by hydrolyzing with tetraalkylammonium hydroxide (TAAOH) for ensuring an elastic modulus of no less than 5 GPa and a hardness of no less than 0.6 GPa.

There is no particular restriction for a coating solvent of the coating type porous silica film as long as siloxane resin of the porous silica precursor can be dissolved. For example, alcohols such as methyl alcohol, ethyl alcohol, propyl alcohol, or tert-butyl alcohol, phenols such as phenol, cresol, diethylphenol, triethylphenol, propylphenol, nonylphenol, vinylphenol, or allylphenol, ketones such as cyclohexanone, methyl isobutyl ketone, or methyl ethyl ketone, cellosolves such as methyl cellosolve or ethyl cellosolve, hydrocarbons such as hexane, octane, or decane, or glycols such as propylene glycol, propylene glycol mono methyl ether, or propylene glycol mono methyl ether acetate may be used as the solvent.

The method for forming the porous silica film may include a step of coating a substrate with a liquid composition, a first heating step for heating the substrate under a temperature of 80–350° C., and a second heating step for curing the substrate under a temperature of 350–450° C.

Furthermore, it is preferable to execute the first and second heating steps under an inert gas atmosphere having an oxygen concentration of 100 ppm or less. Such oxidizing of the porous silica film prevents humidity resistance from being lowered.

Next, the porous silica film is described in further detail.

For example, first, tetra etoxy silane 20.8 g (0.1 mol), methyl tri etoxy silane 17.8 g (0.1 mol), glycidexypropyltrimetoxy silane 23.6 g (0.1 mol), and methylisobutyl ketone 39.6 g (200 mol) are prepared in a reaction tube, and 1% of tetramethyl ammonium hydro oxide of 16.2 g (0.9 mol) is dropped thereon for 10 minutes. After the dropping, it is matured for two hours.

Next, after 5 g of magnesium sulfate is added and excess moisture is removed, the ethanol obtained from the maturing is removed until the reaction solution becomes 50 ml. Then, by adding 20 ml of methylisobutylketone to the obtained reaction solution, the porous silica precursor coating solution is obtained.

The obtained porous silica precursor coating solution is applied on a substrate with a spin coating method. Then, the substrate is thermally processed at a temperature of 250° C. for three minutes. Then, the cross-linking efficiency of the substrate is measured. A FT-IR (Fourier transform infrared spectrophotometer apparatus) is used for measuring the cross-linking efficiency. A cross-linking efficiency of 75% is obtained according to the calculation results obtained from the absorption strength of the Si—OH proximal to 950 cm-1.

Next, the substrate is subject to a heating step, in which the substrate is cured in a $N_2$ gas atmosphere electric furnace at a temperature of 400° C. for 30 minutes. Then, the electrical characteristics are measured with a mercury probe. By calculating the measured results, a dielectric constant of 2.24 is obtained from the porous silica film. Furthermore, the elastic modulus of the porous silica film is 8 GPa and the hardness of the porous silica film is 0.9 GPa.

Accordingly, the porous insulating film obtained in the above-described process is employed as the porous insulating films 10, 15 in the semiconductor apparatus 30 shown in FIG. 4.

Next, a method of manufacturing the semiconductor apparatus shown in FIG. 4 is described.

FIG. 7A–7F show a method of manufacturing the semiconductor apparatus 30 shown in FIG. 4, in which the method is illustrated until the process of forming the Cu wiring part 17. It is to be noted that like components are denoted with like numerals as of the above-described embodiment of the present invention and are not further explained.

Figure 7A:
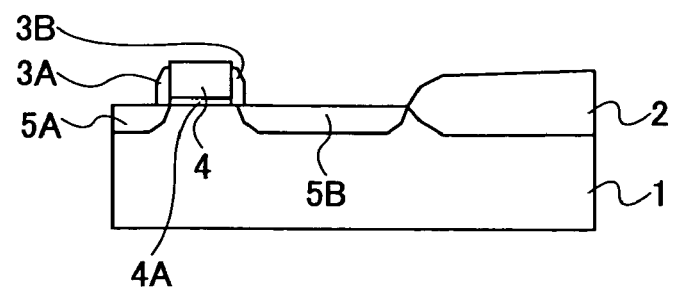
FIGS. 7A–7F are drawings for describing a manufacturing process (Part 1) of the semiconductor apparatus shown in FIG. 4.
Figure 7B:
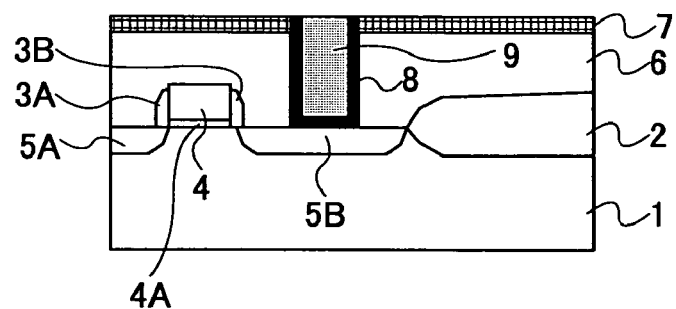

On a Si wafer (Si substrate) 1, diffusion layers 5A, 5B, a gate electrode 4 situated on a gate insulating film 4A, and side wall insulating films 3A, 3B are disposed at an element area which is separated by an element separating film 2, as shown in FIG. 7A.

Next, an interlayer dielectric 6 is formed as a PSG (phosphosilicate glass) film on the Si substrate in a manner covering the gate electrode 4 and the side wall insulating films 3A, 3B.

A stopper film 7 is formed on the interlayer dielectric 6. The stopper film 7 is dry-etched for forming a contact hole for extracting an electrode. A barrier film 8 made of TiN is formed with a thickness of 50 nm in the contact hole by employing a sputtering method. Then, by mixing and reducing $WF_6$ and hydrogen, a contact plug 9 made of W is obtained and buried therein. Then, the stopper film 7 and the contact plug 9 are ground and flattened with CMP to a state shown in FIG. 7B.

Figure 7C:
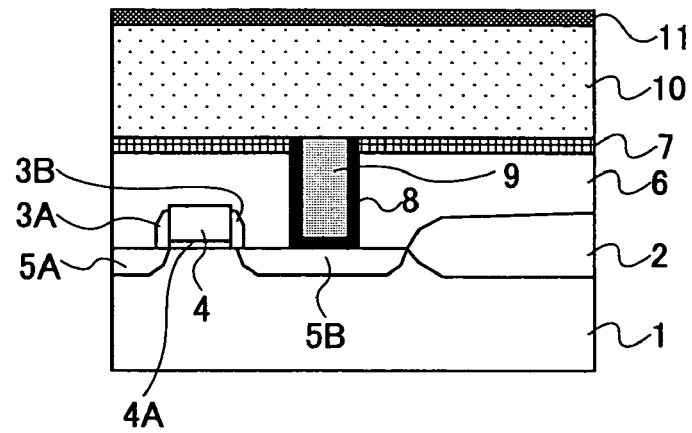

Next, as shown in FIG. 7C, a porous insulating film 10 made of a porous silica film is formed with a thickness of 250 nm on the flattened stopper film 7 and the contact plug 9 by employing the above-described method. Then, a protective film 11 made of TEOS (tetra etoxy silane)-SiO2 is formed with a thickness of 50 nm on the porous insulating film 10.

Figure 7D:
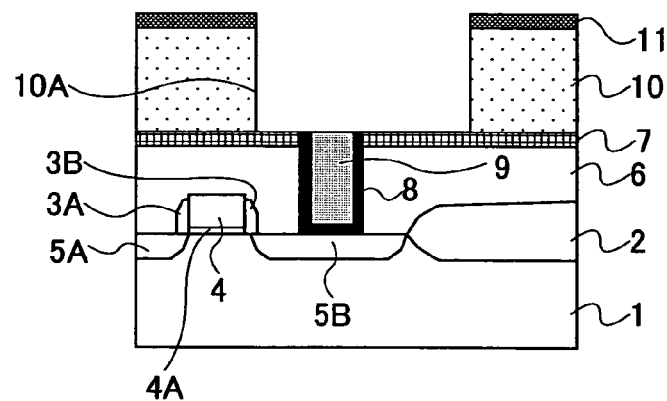

Next, as shown in FIG. 7D, a resist layer (not shown), being provided with a wiring pattern, is disposed on the protective film 11. By using the resist layer as a mask, a wiring groove(s) 10A is formed by dry etching with an F-plasma containing $CF_4/CHF_3$ gas.

Figure 7E:
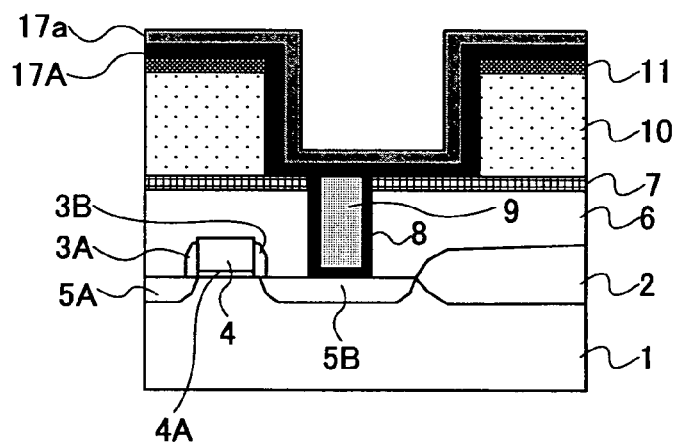

Next, as shown in FIG. 7E, a barrier film 17A made of TiN, serving as a diffusion barrier for the porous insulating film 10 with respect to Cu, is formed with a thickness of 50 nm on the wiring groove 10A by employing a sputtering method. Then, a Cu seed layer 17a, serving as an electrode during electroplating, is formed with a thickness of 50 nm on the wiring groove 10A via the barrier film 17A by employing a sputtering method.

Figure 7F:
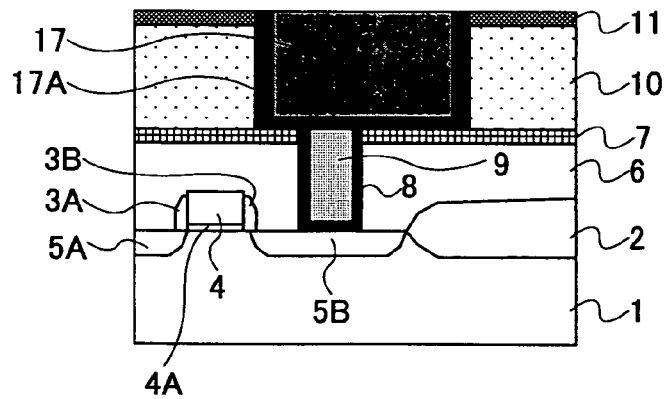

Next, as shown in FIG. 7F, a Cu wiring part 17 is formed with a thickness of 600 nm by an electroplating method. Then, by removing metal materials except for the wiring part with CMP, a wiring layer is obtained as shown in FIG. 7F.

As for methods for forming the Cu plug part 18 and the Cu wiring part 19 from the state shown in FIG. 7F, there are, for example, a dual damascene method which forms the Cu plug part 18 and the Cu wiring part 19 at the same time, or a single damascene method which forms the Cu plug part 18 and the Cu wiring part 19 separately.

Next, an example using the dual damascene method is described with reference to FIGS. 8A–8E. It is to be noted that like components are denoted with like numerals as of the above-described embodiment of the present invention and are not further explained.

Figure 8A:
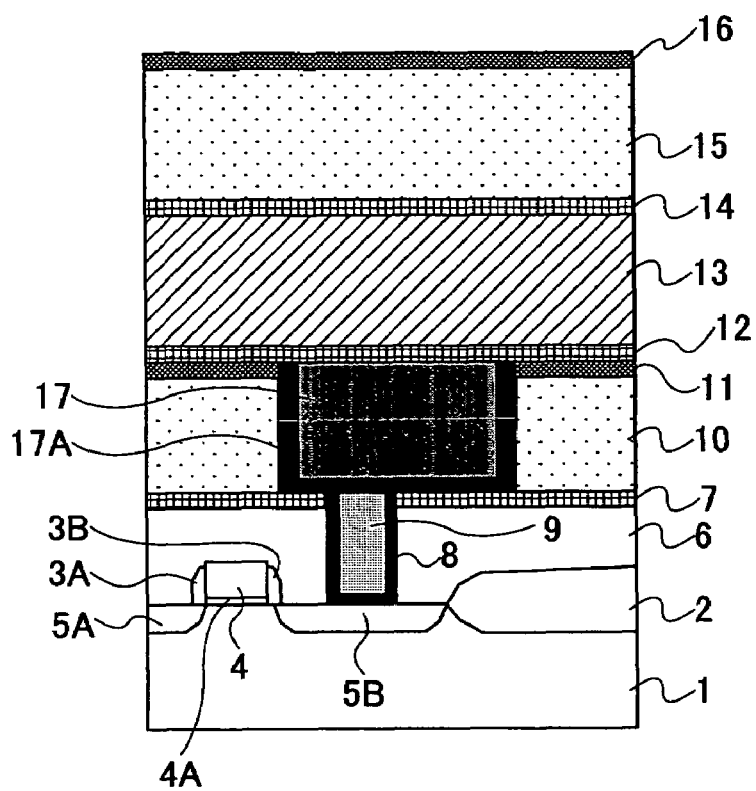
FIGS. 8A–8E are drawings for describing a manufacturing process (Part 2) of the semiconductor apparatus shown in FIG. 4.

First, with reference to FIG. 8A, a stopper film 12 made of SiN for preventing Cu diffusion is formed on the protective layer 11 and the Cu wiring part 17 (in the state shown in FIG. 7F) to a thickness of 50 nm by employing a plasma CVD method using silane and ammonia gas. Then, an insulating film 13 made of SiOC is formed on the stopper film 12 to a thickness of 250 nm by employing the above-described plasma CVD method.

Then, a stopper film 14 made of SiN is formed on the insulating film 13 to a thickness of 50 nm by employing the plasma CVD method using silane and ammonia gas. Then, a porous insulating film made of a porous silica film is formed on the stopper film 14 to a thickness of 400 nm by employing the same method for forming the porous insulating film 10. Then, a protective film 16 made of TEOS-$SiO_2$ is formed on the porous insulating film 15 to a thickness of 50 nm.

Figure 8B:
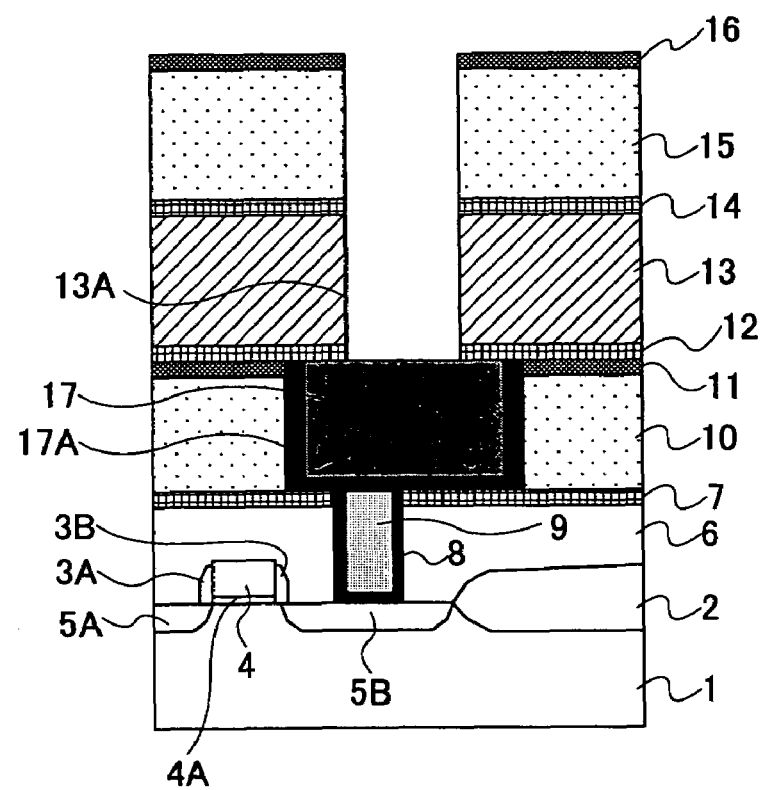

Next, with reference to FIG. 8B, resist (not shown) having a via pattern formed thereto is disposed on the protective film 16. By using the resist as a mask, a dry etching process is performed by using an F-plasma containing $CF_4/CHF_3$ gas. Thereby, a via hole 13A is formed. In performing the dry etching process, the gas ratio of $CF_4/CHF_3$ is to be adjusted depending on the film that is to be etched since each of the protective film 16, the porous insulating film 15, the stopper films 12, 14, and the insulating film 13 have different compositions. The dry etching process is performed in the order of the protective film 16, the porous insulating film 15, the stopper film 14, the insulating film 13, and the stopper film 12.

Figure 8C:
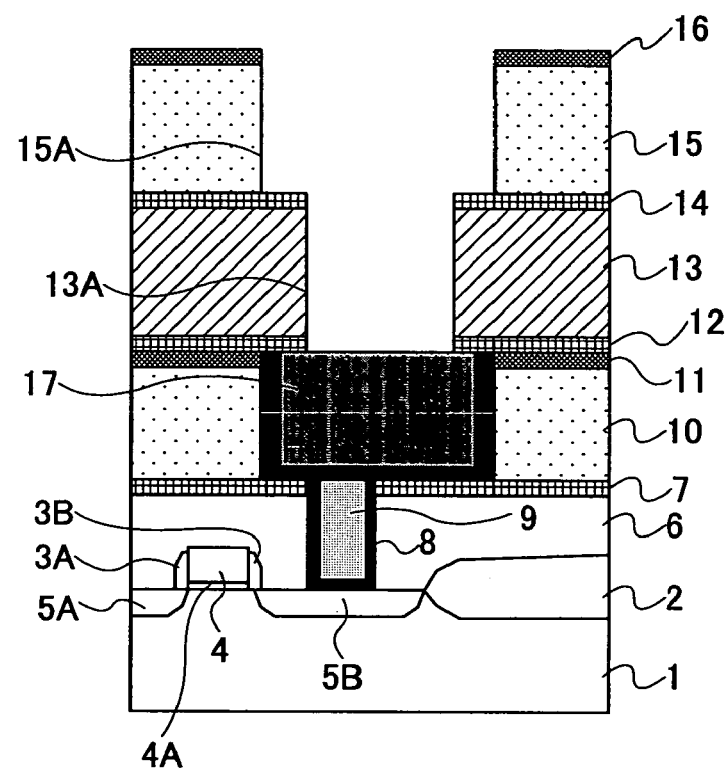

Next, with reference to FIG. 8C, resist (not shown) having a pattern of a Cu wiring part formed thereto is used as a mask for performing a dry etching process using an F-plasma containing $CF_4/CHF_3$ gas. Thereby, a wiring groove(s) 15A is formed.

Figure 8D:
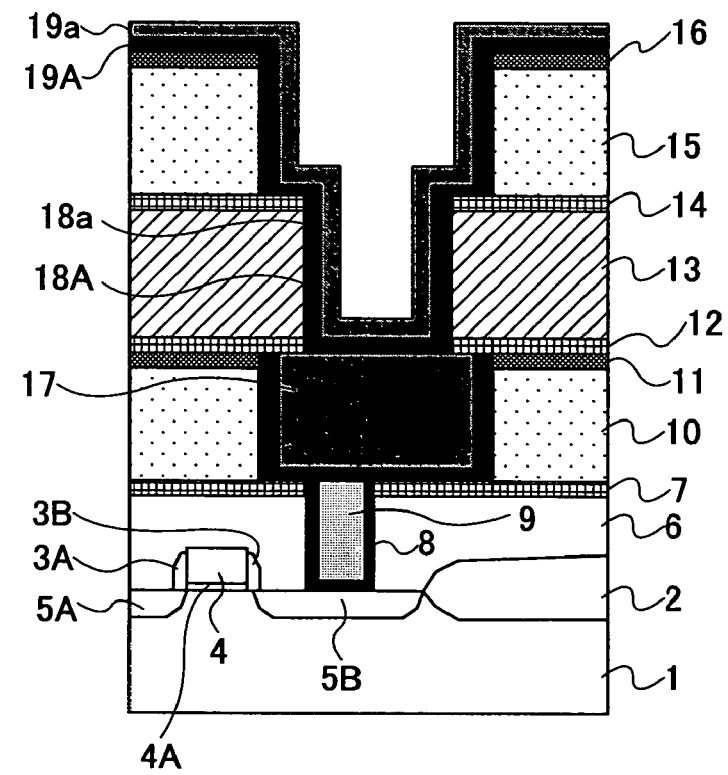

Next, with reference to FIG. 8D, barrier films 18A and 19A made of TiN are formed on the inner walls of the via hole 13A and the wiring groove 15A for preventing Cu from diffusing into the insulating film 13 and the porous insulating film 15. Each of the barrier films 18A and 19A is formed to a thickness of 50 nm. Furthermore, seed layers 18a and 19a made of Cu are formed on the barrier films 18A and 19A, respectively, for serving as electrodes during a Cu electroplating process. Each of the seed layers 18a and 19a is formed to a thickness of 50 nm by employing a sputtering method.

Figure 8E:
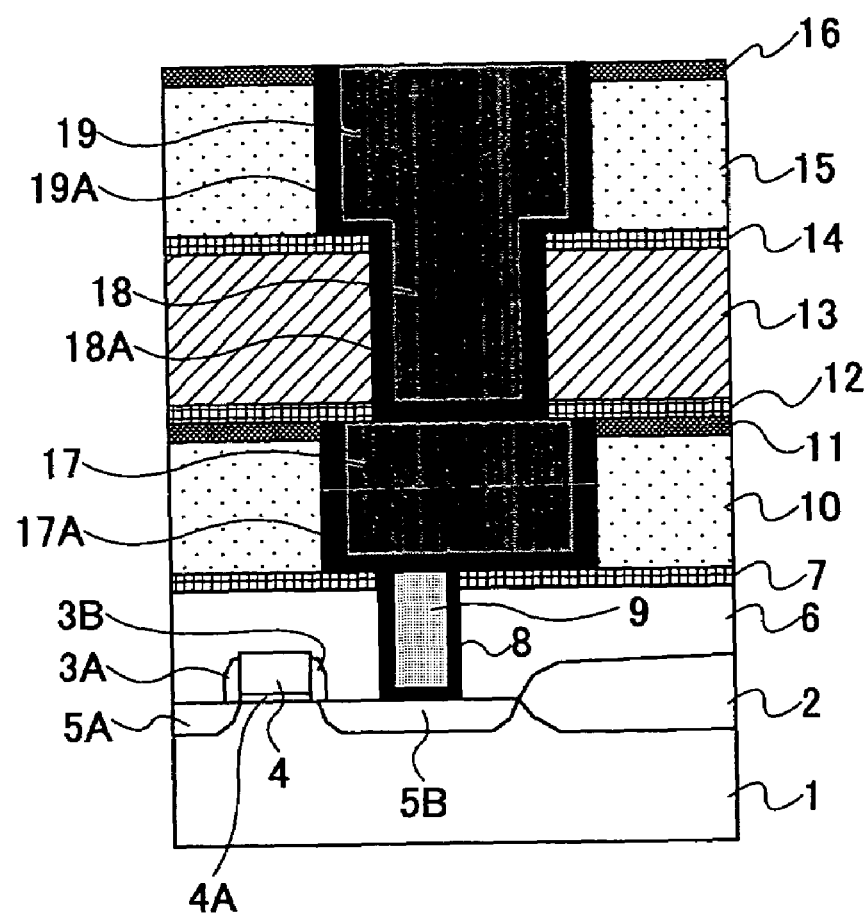

Next, with reference to FIG. 8E, an electroplating method is employed to form a Cu layer with a thickness of 1400 nm, to thereby obtain a Cu plug part 18 and a Cu wiring part 19. Then, by removing metal material except for the wiring patterns with CMP, a three layer wiring structure is obtained.

As an alternative of the dual damascene method described with FIGS. 8A–8E, a single damascene method (as shown below in FIGS. 9A–9H) may be employed. It is to be noted that like components are denoted with like numerals as of the above-described embodiment of the present invention and are not further explained.

Figure 9A:
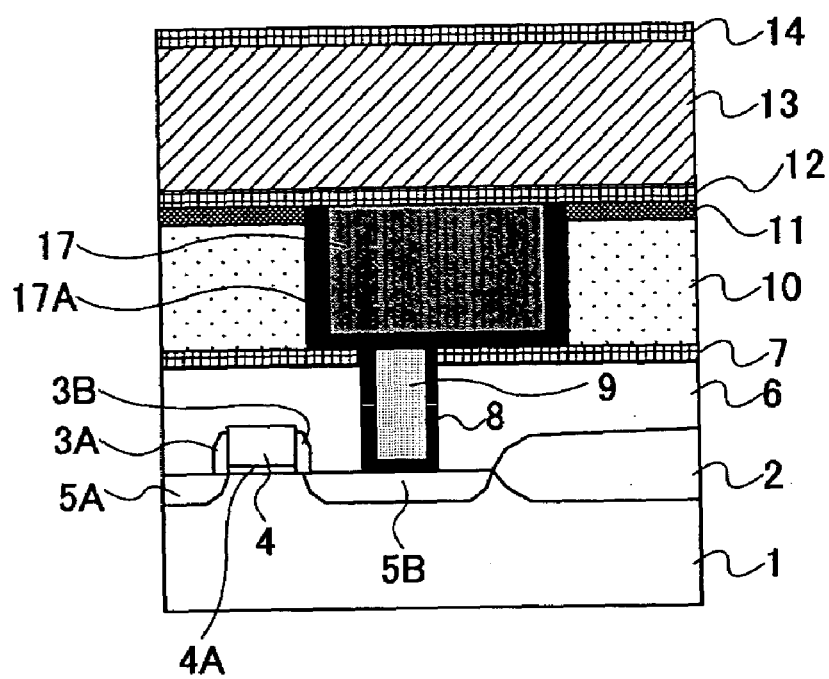
FIGS. 9A–9H are drawings for describing a modified example of the manufacturing process shown in FIGS. 8A–8F.

First, with reference to FIG. 9A, a stopper film 12 made of SiN for preventing Cu diffusion is formed on the protective layer 11 and the Cu wiring part 17 (in the state shown in FIG. 7F) to a thickness of 50 nm by employing a plasma CVD method using silane and ammonia gas. Then, an insulating film 13 made of SiOc is formed on the stopper film 12 to a thickness of 250 nm by employing the above-described plasma CVD method. Then, a stopper film 14 made of SiN is formed on the insulating film 13 to a thickness of 50 nm by employing the plasma CVD method using silane and ammonia gas.

Figure 9B:
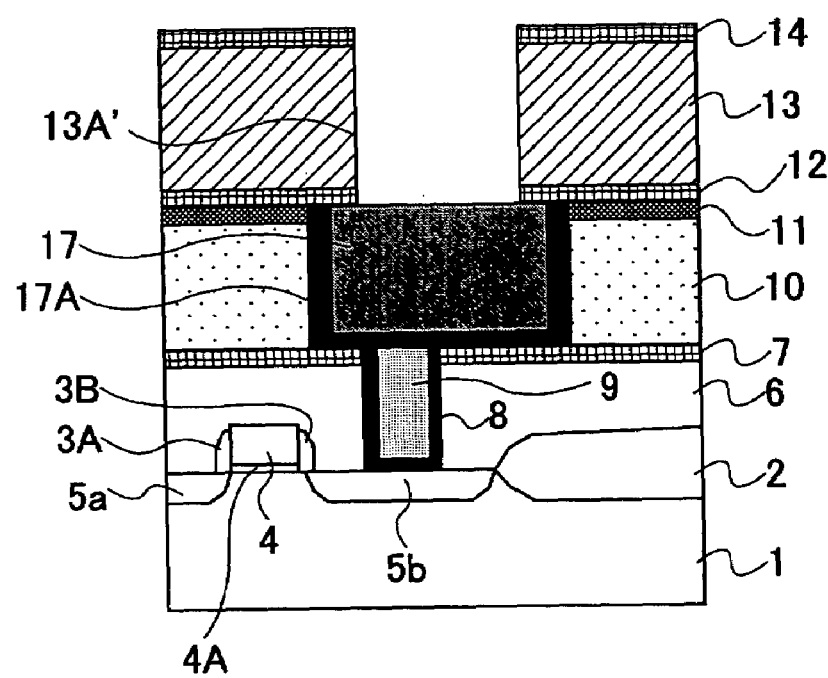

Next, with reference to FIG. 9B, resist (not shown) having a via pattern formed thereto is disposed on the protective film 14. By using the resist as a mask, a dry etching process is performed by using an F-plasma containing $CF_4/CHF_3$ gas. Thereby, a via hole 13A' is formed.

Figure 9C:
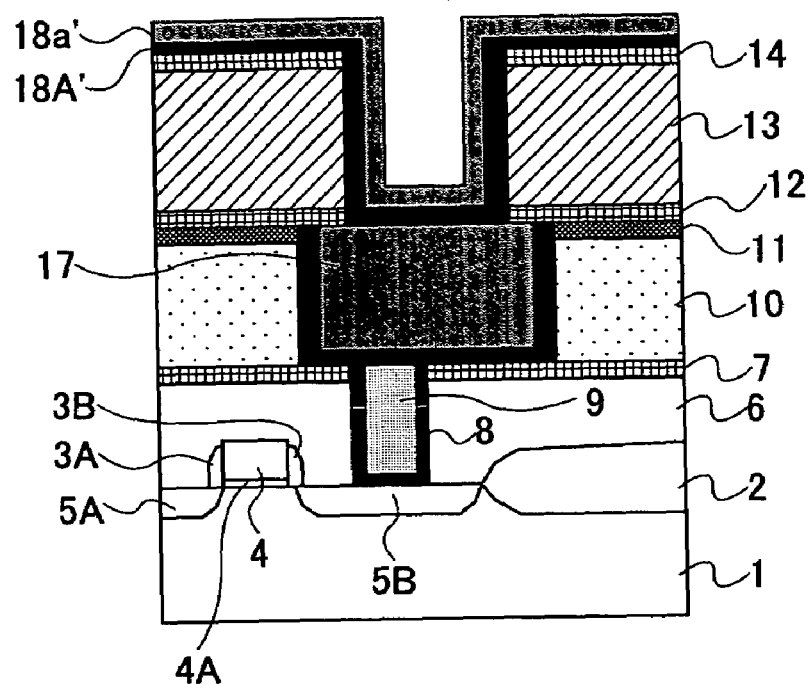

Next, with reference to FIG. 9C, a barrier film 18A' made of TiN is formed on the inner wall of the via hole 13A' for preventing Cu from diffusing into the insulating film 13. The barrier film 18A' is formed to a thickness of 50 nm. Furthermore, a seed layer 18a' made of Cu is formed on the barrier film 18A' for serving as an electrode during a Cu electroplating process. The seed layer 18a' is formed to a thickness of 50 nm by employing a sputtering method.

Figure 9D:
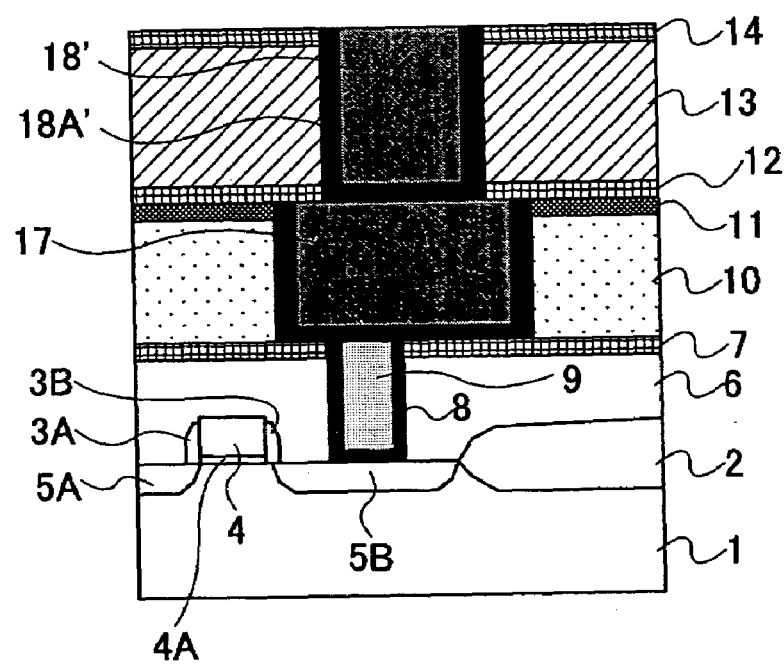

Next, with reference to FIG. 9D, an electroplating method is employed to form a Cu layer with a thickness of 1400 nm, to thereby obtain a Cu plug part 18'. Then, by removing metal material except for the Cu plug part 18' with CMP, a layer including the Cu plug part 18' is obtained.

Figure 9E:
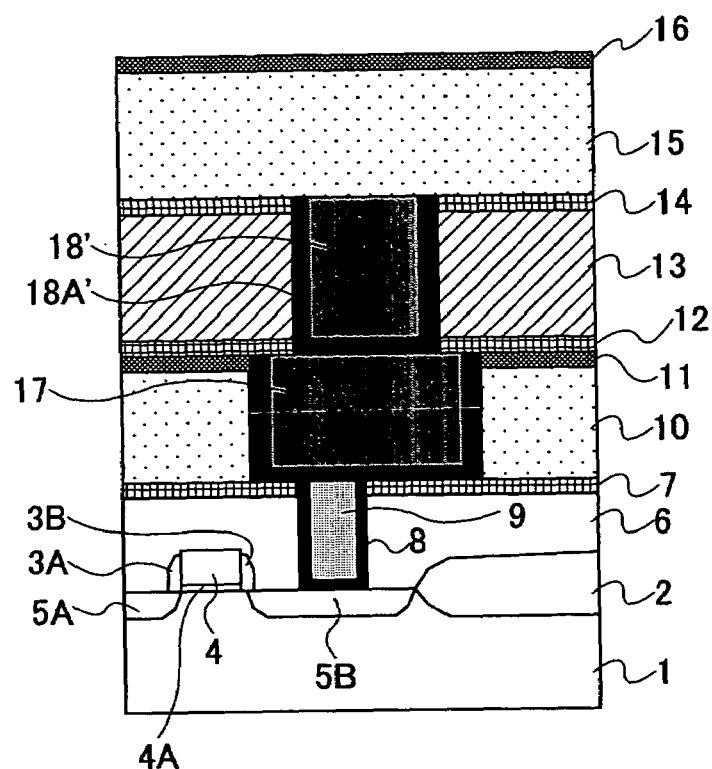

Next, with reference to FIG. 9E, a porous insulating film 15 made of a porous silica film is formed on the protective film 14 and the Cu plug part 18' to a thickness of 400 nm by employing the above-described method for forming the porous insulating film. Then, a protective film 16 made of TEOS-$SiO_2$ is formed on the porous insulating film 15 to a thickness of 50 nm.

Figure 9F:
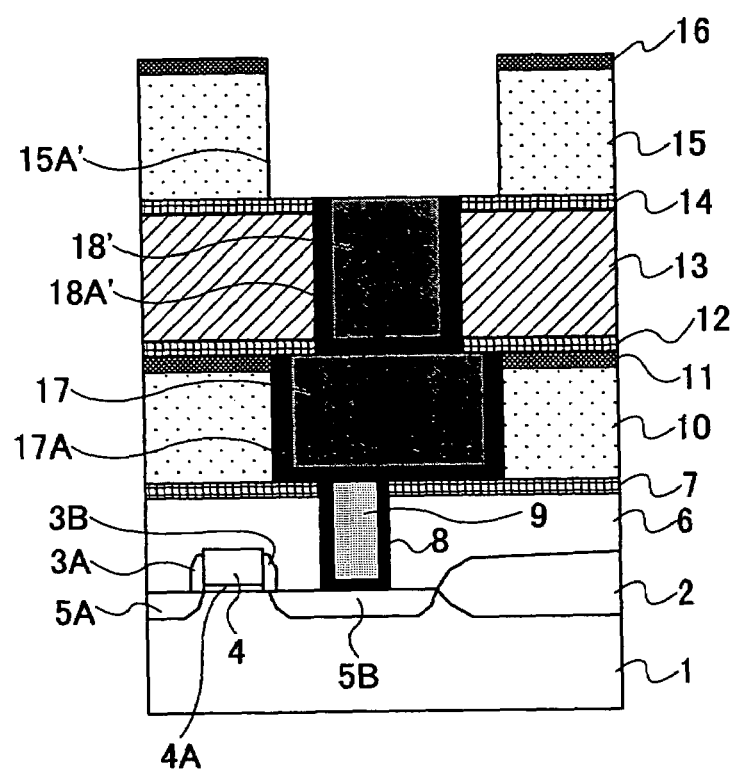

Next, with reference to FIG. 9F, resist (not shown) having a pattern of a Cu wiring part formed thereto is used as a mask for performing a dry etching process using an F-plasma containing $CF_4/CHF_3$ gas. Thereby, a wiring groove(s) 15A' is formed.

Figure 9G:
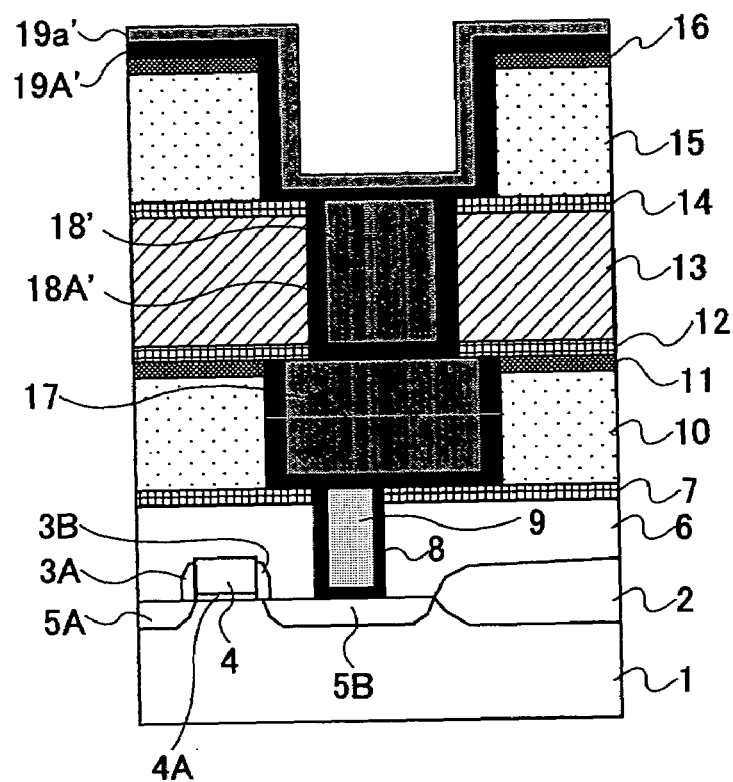

Next, with reference to FIG. 9G, a barrier film 19A' made of TiN is formed on the inner wall of the wiring groove 15A' for preventing Cu from diffusing into the porous insulating film 15. The barrier film 19A' is formed to a thickness of 50 nm. Furthermore, a seed layer 19a' made of Cu is formed on the barrier film 19A' for serving as an electrode during a Cu electroplating process. The seed layer 19a' is formed to a thickness of 50 nm by employing a sputtering method.

Figure 9H:
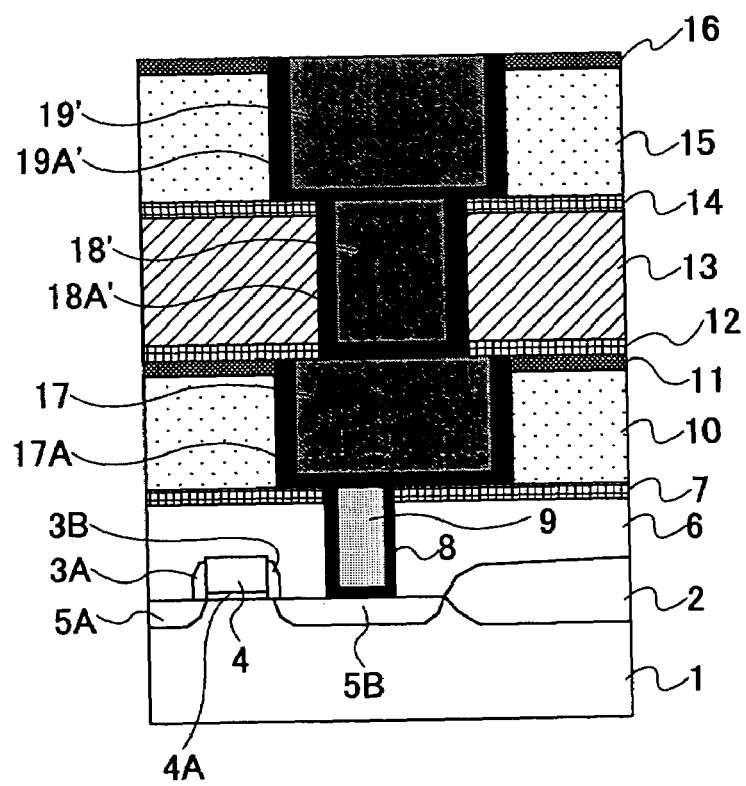

Next, with reference to FIG. 9H, an electroplating method is employed to form a Cu layer with a thickness of 1400 nm, to thereby obtain a Cu wiring part 19'. Then, by removing metal material except for the Cu wiring part 19' with CMP, a three layer wiring structure is obtained.

Although a three layer wiring structure is formed by performing the processes (steps) shown in FIGS. 8A–8E and FIGS. 9A–9H, other multilayer wiring structures may also be formed. For example, a five layer wiring structure, as shown in FIG. 10, may be formed.

Figure 10:
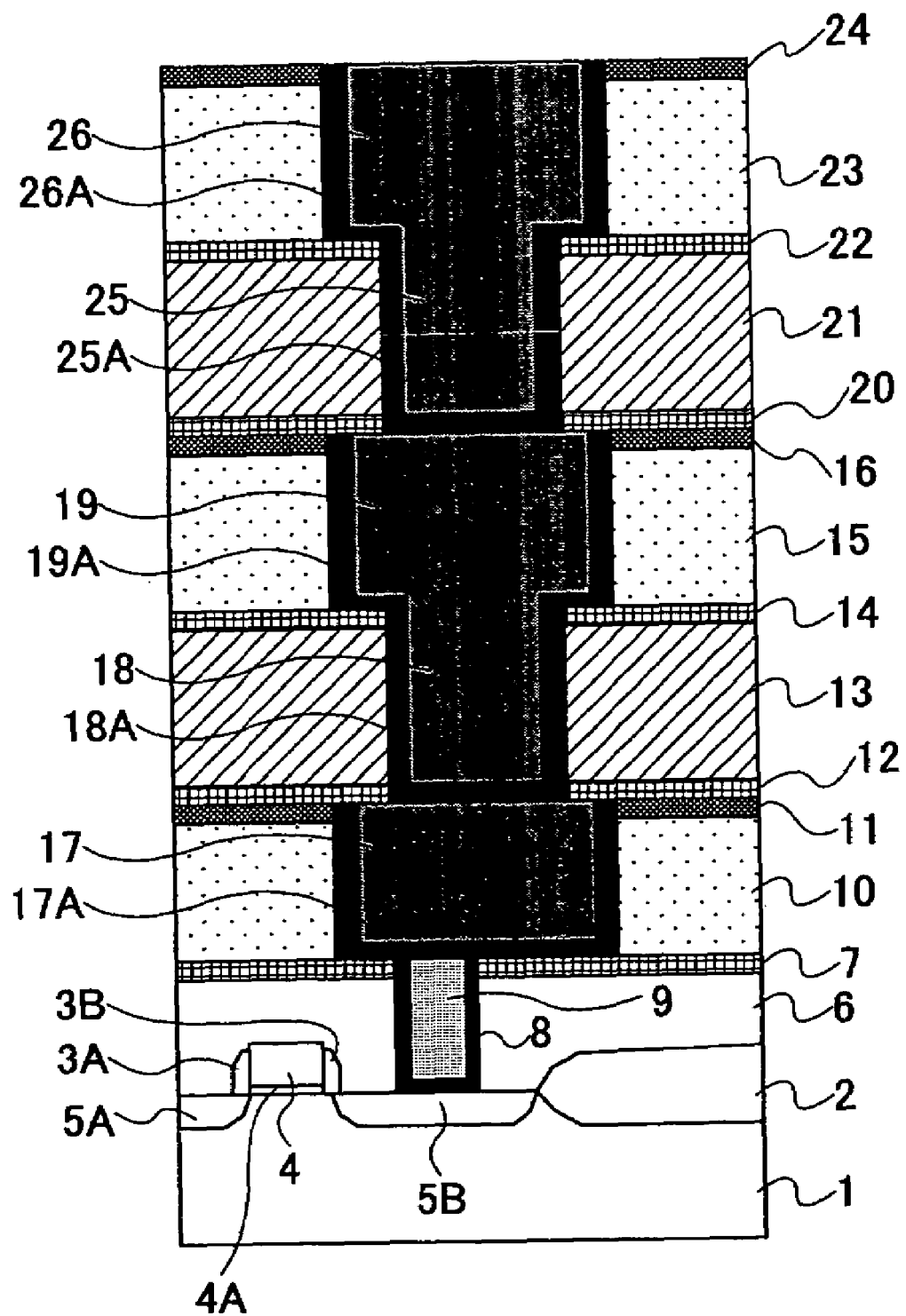
FIG. 10 is a schematic drawing showing a configuration of a semiconductor apparatus having a multilayer wiring structure according to a second embodiment of the present invention.

By repeating the processes shown in FIGS. 8A–8E, the five layer wiring structure shown in FIG. 10 can be formed including the stopper film 20, the insulating film 21, the porous insulating film 23, the protective film 24, the Cu plug part 25, the Cu wiring part 26, and the barrier films 25A, 26A. Furthermore, the single damascene method may be employed for forming the multilayer wiring structure.

Accordingly, the single damascene method and the dual damascene method can be selectively employed in a combination for manufacturing the semiconductor apparatus having the multilayer wiring structure according to the embodiment of the present invention.

In examining the yield of the Cu plug part in fabricating the multilayer wiring structure with the processes shown in FIG. 7A–7F or 8A–8E, the Cu plug part demonstrated a yield of no less than 95% in fabricating 1 million wiring structures.

Next, a case of forming a contact pad on the semiconductor apparatus 30 (shown in FIG. 4) and executing a wiring process is described.

Figure 11A:
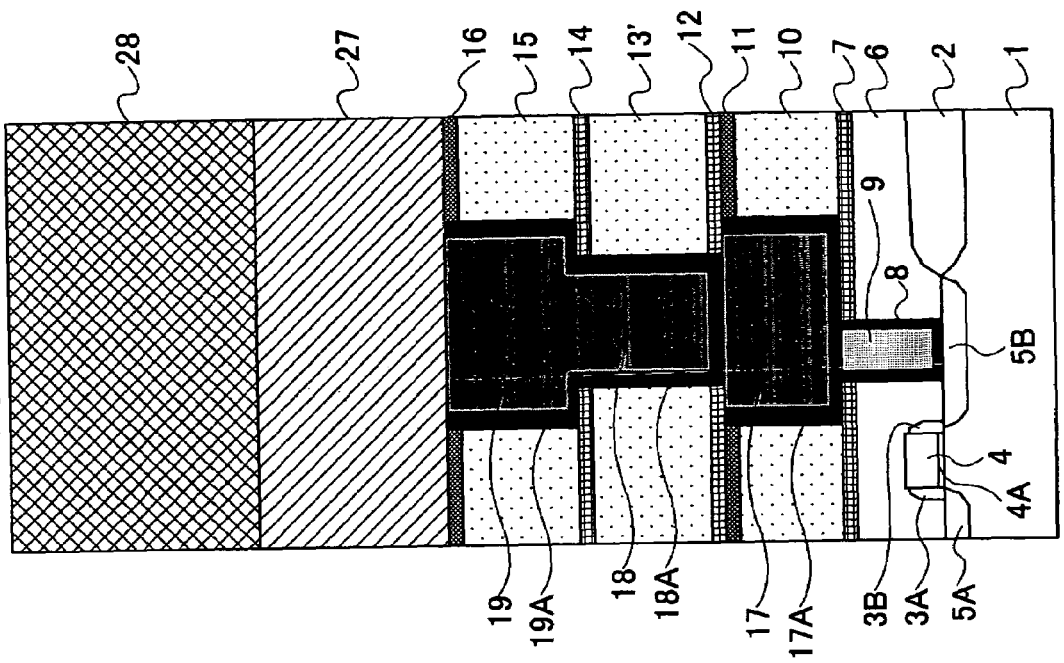
FIGS. 11A–11B are drawings showing a state where a contact pad is formed on a semiconductor apparatus having a multilayer wiring structure.
Figure 11B:
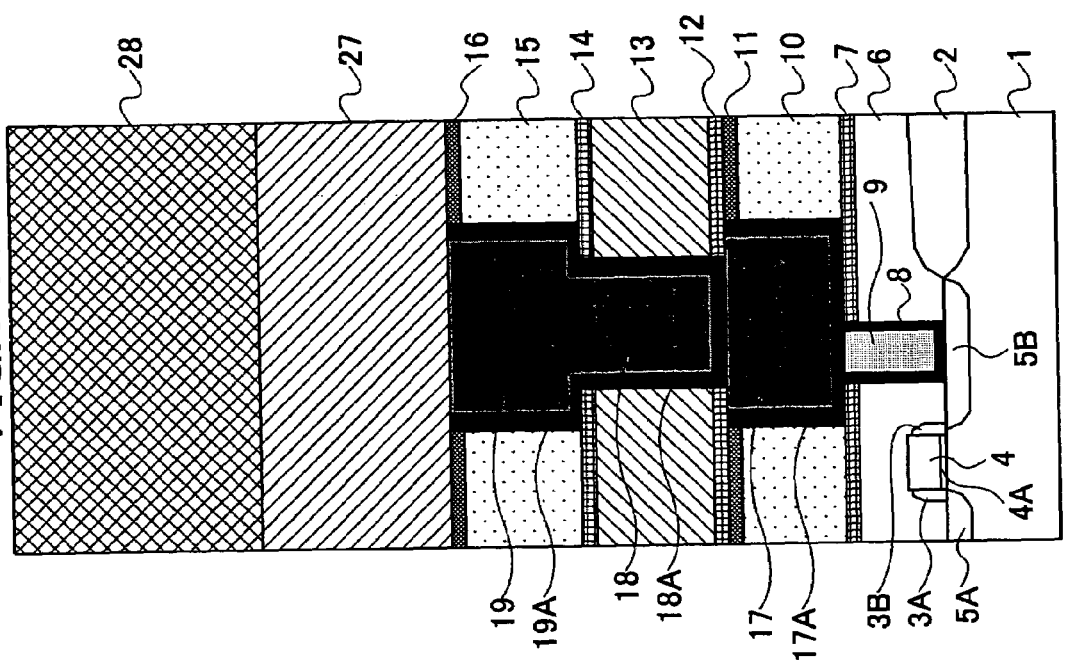

FIG. 11A shows a state where the semiconductor apparatus 30 is formed with a cap layer 27 and a contact pad 28 situated on the cap layer 27. It is to be noted that like components are denoted with like numerals as of the above-described embodiment of the present invention and are not further explained. For the purpose of comparison, FIG. 11B shows the semiconductor apparatus 30 in a case where the insulating film 13 made of SiOC film is replaced with the porous insulating film 13'. It is to be noted that like components are denoted with like numerals as of the above-described embodiment of the present invention and are not further explained.

Problems such as deformation or damage due to wire bonding pressure did not occur when performing a wire bonding process on the contact pad 28 of the semiconductor apparatus 30 shown in FIG. 11A. On the other hand, problems such as cracks in the porous insulating film 13' were found when performing a wire bonding process on the contact pad 28 of the semiconductor apparatus shown in FIG. 11B. The pressure created in the wire bonding process is considered to cause pressure to concentrate on the contact plug part and lead to deformation of the contact plug and damaging of the porous insulating film.

Since the semiconductor apparatus 30 having the multilayer wiring structure of the present invention (shown in FIG. 11A) employs an insulating layer having an elastic modulus of 10 GPa or more and a hardness of 1 GPa or more, the multilayer wiring structure of the semiconductor apparatus 30 of the present invention can be prevented from being damaged and deformed due to pressure such as wire bonding pressure. Furthermore, the multilayer wiring structure of the semiconductor apparatus 30 of the present invention can be prevented from being adversely affected by stress created in superposing the layers or from thermal stress.

Furthermore, since a porous insulating film is an interlayer dielectric having a low dielectric constant of 2.5 or less, the parasitic capacity between Cu wirings can be reduced to a small amount, to thereby prevent wire delay and enable high speed operation for the semiconductor apparatus 30.

Further, the present invention is not limited to these embodiments, but various variations and modifications may be made without departing from the scope of the present invention.

What is claimed is:

1. A semiconductor apparatus comprising:
   a substrate;
   a first insulating layer formed on the substrate, the first insulating layer including a Cu wiring part; and
   a second insulating layer formed on the substrate, the second insulating layer including a Cu via plug part electrically connected to the Cu wiring part;
   wherein the first insulating layer is a porous insulating film having an elastic modulus of 5 GPa or more and a hardness of 0.6 GPa or more, and the second insulating layer has an elasticity modulas of no less than 10 GPa and a hardness no less than 1 GPa.

2. The semiconductor apparatus as claimed in claim 1, wherein the porous insulating film includes a porous silica film.

3. The semiconductor apparatus as claimed in claim 2, wherein the porous silica film has a dielectric constant that is no more than 2.5.

4. The semiconductor apparatus as claimed in claim 2, wherein the porous silica film is formed on the substrate by spin coating the substrate with a liquid composition containing an organic silicon compound obtained by hydrolysis under the presence of tetraalkylammonium hydroxide and heating the spin-coated substrate.

5. The semiconductor apparatus as claimed in claim 1, wherein the second insulating film is formed by a plasma CVD method.

6. The semiconductor apparatus as claimed in claim 5, wherein the second insulating film includes an SiOC film.

7. The semiconductor apparatus as claimed in claim 1, wherein the substrate includes Si, wherein the substrate has an active element formed thereon.

8. The semiconductor apparatus as claimed in claim 1, wherein the Cu wiring part is fabricated by forming a wiring groove by etching the first insulating film and burying Cu into the wiring groove.

9. The semiconductor apparatus as claimed in claim 8, wherein the via plug part is fabricated by forming a via hole in the second insulating layer and burying Cu into the via hole.

10. The semiconductor apparatus as claimed in claim 9, wherein the Cu wiring part and the Cu plug part are formed by a dual damascene method for burying the Cu in the wiring groove and burying the Cu in the via hole at the same time.

11. The semiconductor apparatus as claimed in claim 1, wherein the first insulating film is formed on a first principle surface and a second principle surface of the second insulating layer.

* * * * *